United States Patent [19]
Komatsu et al.

[11] Patent Number: 5,023,443
[45] Date of Patent: Jun. 11, 1991

[54] IMAGE SENSOR AND ITS DRIVING METHOD

[75] Inventors: Katsuaki Komatsu, Hino; Hideo Watanabe, Hachioji; Atsushi Takahashi, Hino, all of Japan

[73] Assignee: Konica Corporation, Tokyo, Japan

[21] Appl. No.: 466,593

[22] Filed: Jan. 17, 1990

[30] Foreign Application Priority Data

Jan. 18, 1989 [JP] Japan ................................. 64-9143
Jan. 20, 1989 [JP] Japan ............................... 64-11546
Jan. 20, 1989 [JP] Japan ............................... 64-11547
Mar. 6, 1989 [JP] Japan ............................... 64-53211

[51] Int. Cl.$^5$ ......................................... H01J 40/14
[52] U.S. Cl. ............................ 250/208.1; 358/213.18
[58] Field of Search .................................. 250/208.1; 358/212-213.31

[56] References Cited

U.S. PATENT DOCUMENTS 4,495,409 1/1985 Baji et al. ........................ 250/208.1
4,719,512 1/1988 Endo et al. ..................... 358/213.18
4,910,597 3/1990 Harada et al. ................. 358/213.18

Primary Examiner—Davis L. Willis
Assistant Examiner—Que Tan Le
Attorney, Agent, or Firm—Finnegan, Henderson, Farabow, Garrett, and Dunner

[57] ABSTRACT

In an image sensor having plural conversion elements for photoelectrically converting an image into electric signals and a matrix-wired electric circuit, connected to the plural conversion elements, for transmitting the signal therefrom, when reading out the image, all the plural conversion elements are reset at the same time. Thereafter, one of the plural conversion elements is sequentially selected in a predetermined order, and a signal from the selected conversion element is read out through the matrix-wired electric circuit.

3 Claims, 14 Drawing Sheets

FIG. 4
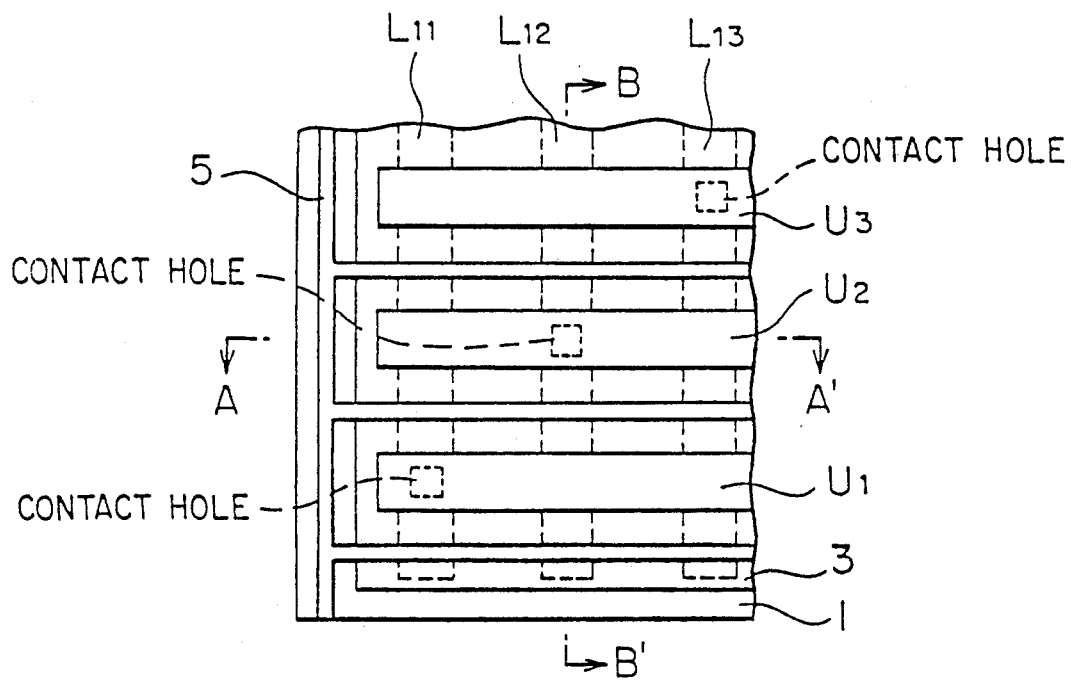
FIG. 5-a
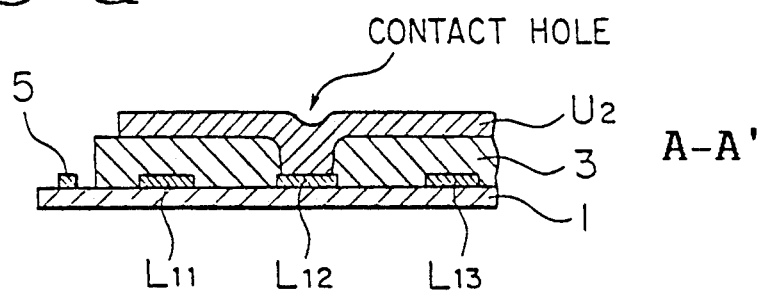
A-A'
FIG. 5-b
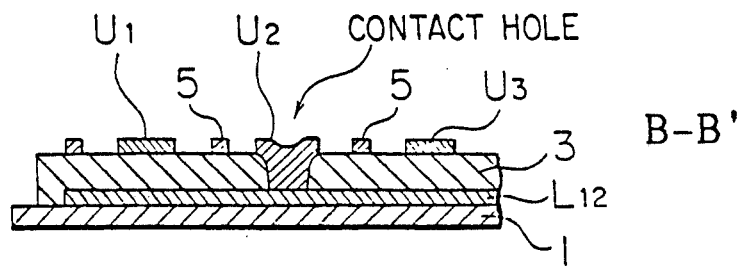
B-B'

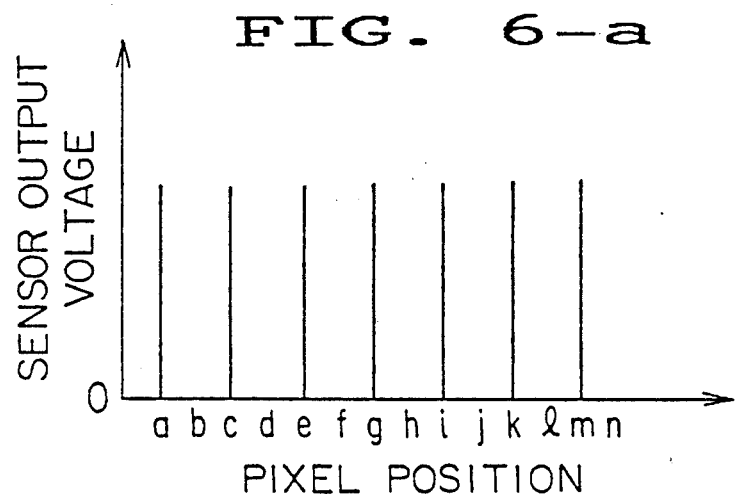
FIG. 6-a
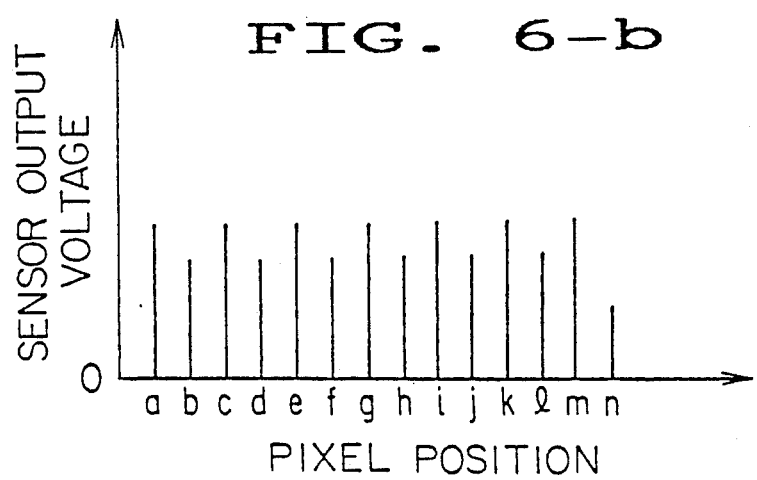
FIG. 6-b
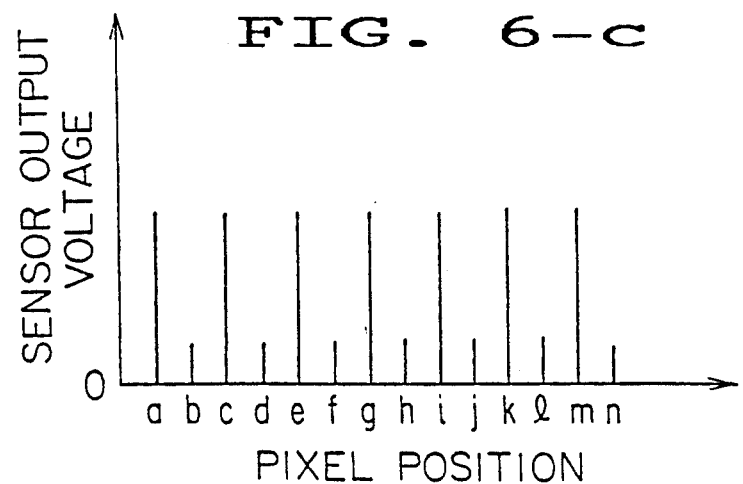
FIG. 6-c

FIG. 7-a
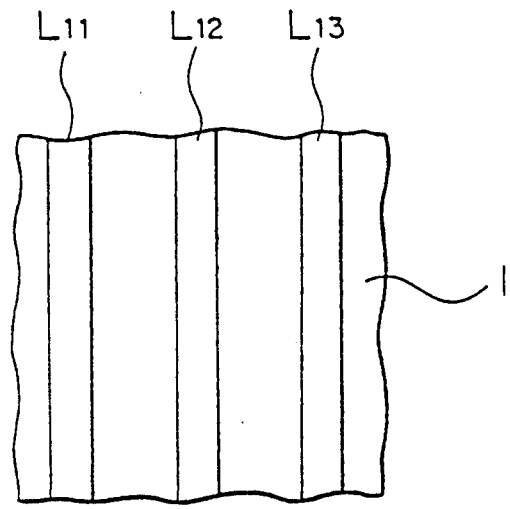
FIG. 7-b
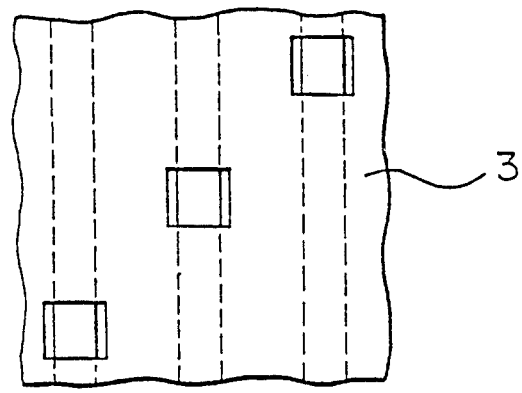
FIG. 7-c
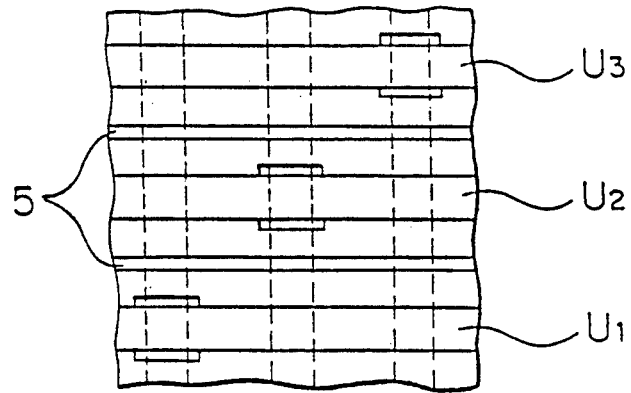

FIG. 8-a
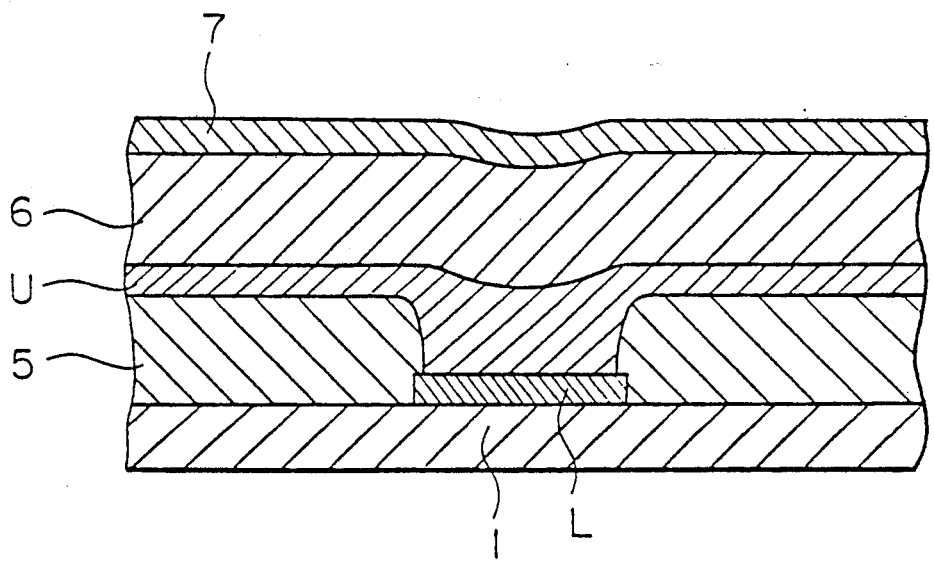
FIG. 8-b
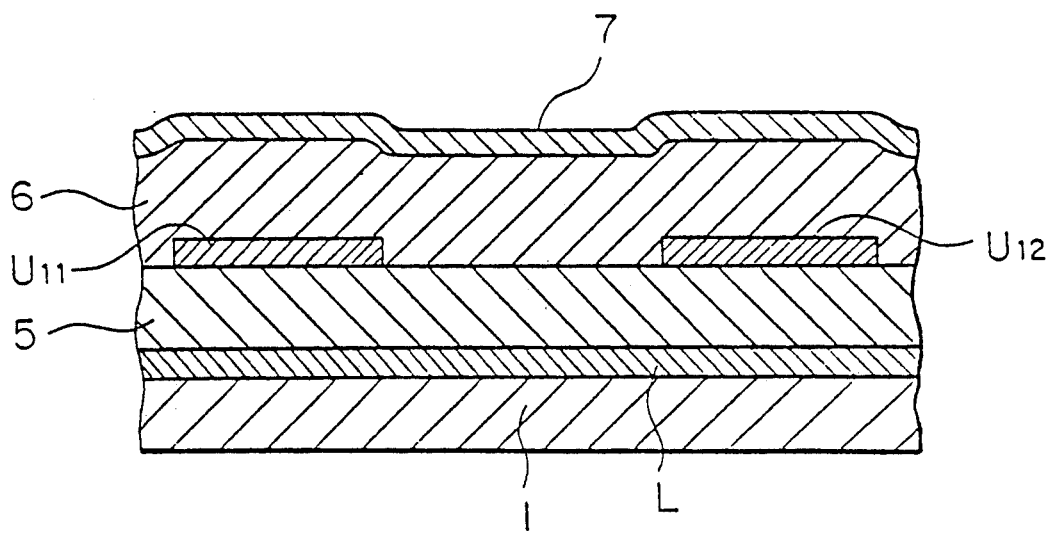

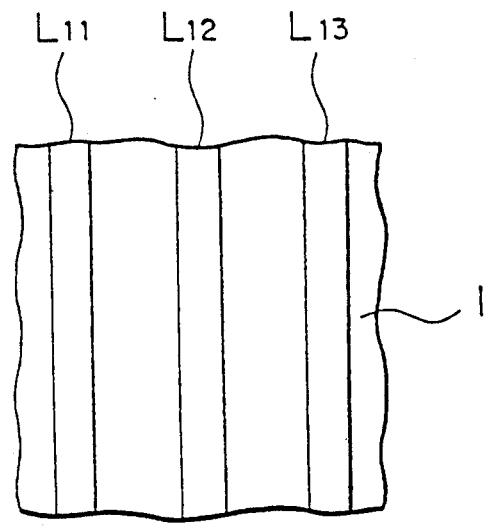
FIG. 9-a
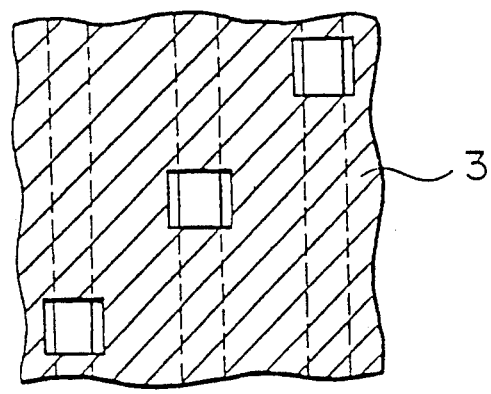
FIG. 9-b
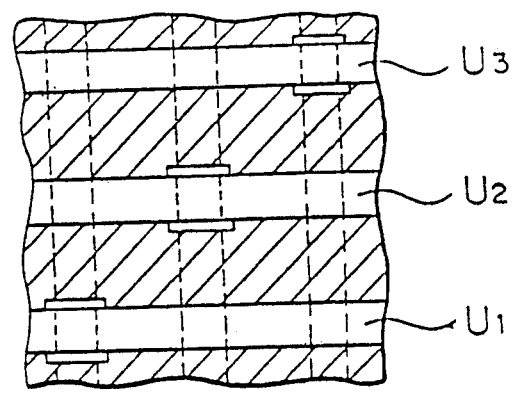
FIG. 9-c

FIG. 18
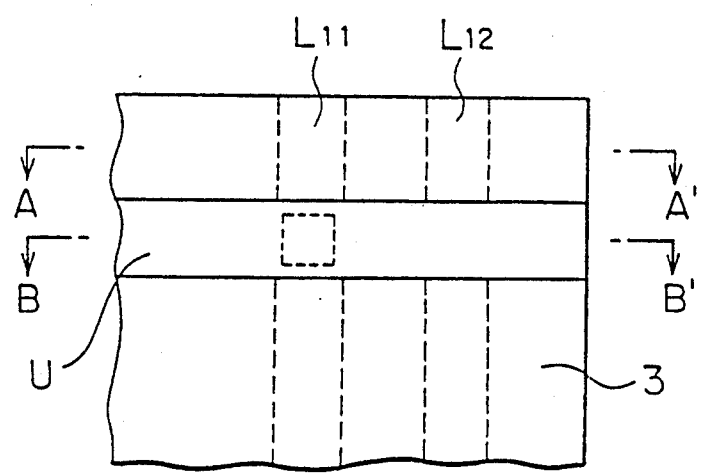
FIG. 19
FIG. 20
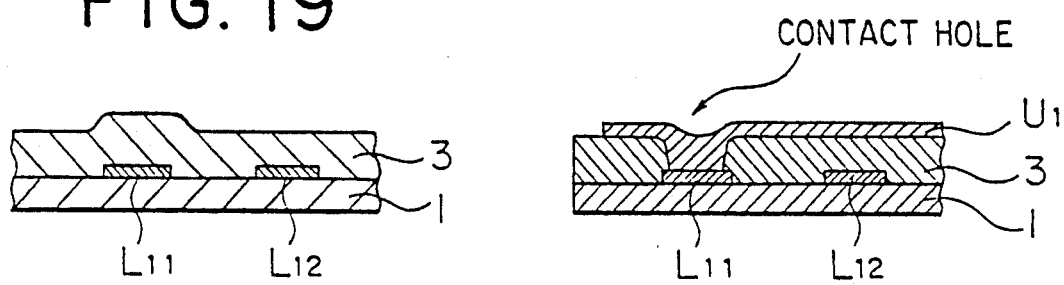
FIG. 21
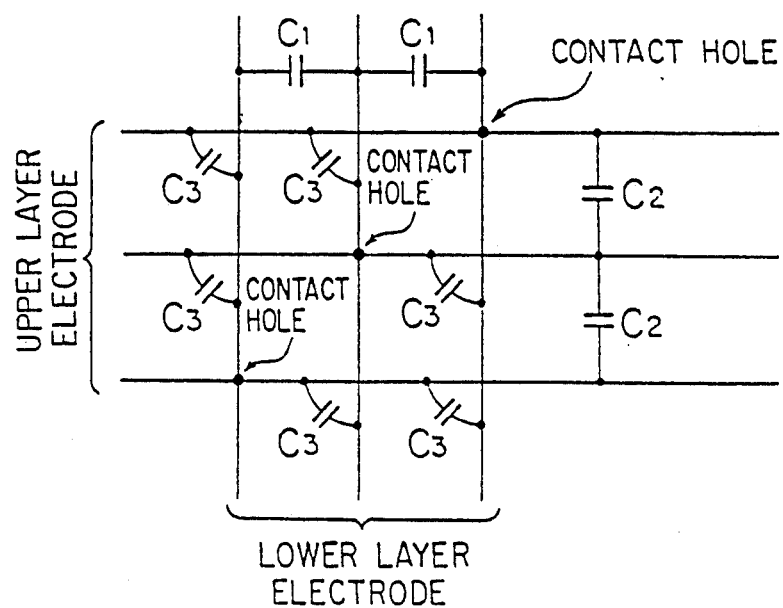

IMAGE SENSOR AND ITS DRIVING METHOD

BACKGROUND OF THE INVENTION

The invention is concerned with an image sensor for reading images and its driving method.

An image sensor consisting of a photodiode array has been used for an image reading device for a facsimile, an image scanner, and the like.

Amorphous silicon has such excellent photoelectric conversion characteristics that it is used as the material to manufacture photodiodes.

A matrix drive system which consists of a small number of drive ICs, as compared with the number of pixels, is often used. The matrix drive system is composed of a photodiode array which is divided into a plurality of blocks. When an image is read, each block is selected in order and a signal corresponding to the amount of exposed light is read out block by block in order.

However, there is a problem in the matrix drive system in which image information is read out as an electric current. The problem is that precise image information can not be obtained because of a fluctuation in the inductance of the wiring connected to the photodiodes, and in stray capacitance between the wiring.

A reading circuit shown in FIG. 14 is proposed to solve the problem.

In FIG. 14, blocks, the number of which is n are connected with the circuit, wherein each block has photoelectric conversion elements the number of which is m. In this circuit diagram, the photoelectric conversion element is shown by an equivalent circuit. Bi is the common connection terminal of each block and connected with the bias potential $-V$ when the block is selected or connected with the ground when the block is not selected. Bi is defined as the common electrode of the block the number of which is i when it is counted from the first block, wherein i is $1 < i < n$. SBi is the switch of the block the number of which is i, when it is counted from the first block, wherein i is $1 < i < n$. Each photoelectric conversion element is represented by an equivalent circuit consisting of blocking diode BD, photodiode PD, accumulating condenser Cp which is connected with photodiode PD in parallel, and condenser CB which is connected with blocking diode BD in parallel. BDij and PDij represent the elements which are in the block, the number of which is i when it is counted from the first block, and the number of which is j in the block i, wherein i is $1 < i < n$ and j is $1 < j < m$. Portion M surrounded by a broken line is the matrix wiring unit. CRj is a condenser for reading out which is connected with each photoelectric conversion element and its capacitance is much larger than that of accumulating condenser Cp. Sj is a reset switch to reset reading out condenser CRj. Aj is a buffer amplifier to receive the potential of reading out condenser CRj. SRj is a selector switch which is used when the output of buffer amplifier Aj is read out. CRj, Sj, Aj, and SRj represent elements the number of which is j, wherein j is $1 < j < m$.

FIG. 15 is a diagram which shows potential being impressed on common electrode Bi which is used to drive the above-described reading cuircuit. Potential $-V$ is impressed on the common electrode Bi in the sequence order, wherein i is $1 < i < n$. As shown in FIG. 14, photoelectric conversion elements are placed in the form of a line. An image is read by a line of photoelectric conversion elements. The time needed to read an image by a line of photoelectric conversion elements is defined as the reading period. Image reading conducted by a line of photoelectric conversion elements in the reading period is repeated.

FIG. 16 is a diagram which shows the time when switch S and SR should be turned on and off in order to read out the information in the block when the potential $-V$ is impressed on common electrode $B_1$. As shown in the diagram, while the potential $-V$ is impressed on common electrode $B_1$, the switches are turned on in the order of SR1→S1→SR2→S2→...→SRm→Sm. In other words, SR is for reading out and S is for resetting condenser (or capacitor) CR after reading out of each block has been completed, referring to 16-i in FIG. 16.

When this type of reading circuit is used, the current corresponding to the amount of light projected to photodiode PD, is charged into condenser CR at the time of selecting a block. As a result, a light signal can be obtained in the sequence order as the voltage between both terminals of condenser CR.

FIG. 17 is a schematic illustration which shows an approximate layout of electric devices shown in FIG. 14, wherein they are laid out on a substrate. In FIG. 17, the numeral 1 is a substrate made from glass or ceramics. The numeral 2 is a diode unit in which photodiode PD and blocking diode BD are laid out. L is a lower layer electrode or a lower layer wire. $L_{11}$ to Lnm are lower layer electrodes which guide the output of each photodiode PDij in the diode unit 2. U is an upper layer electrode or an upper layer wire. $U_1$ to $U_6$ are upper layer electrodes which guide the output from lower layer electrodes $L_{11}$ to Lnm to IC4 for reading. Lower layer electrodes L and upper layer elecrodes U are made from such metals as Al, Cr, Ti, and Mo. The numeral 3 is an insulation layer of $SiO_2$, SiN, and polyimide which is coated between lower layer electrodes L and upper layer electrodes U for insulation. Lower layer electrodes L and upper layer electrodes U are connected through contact holes. As described above, upper layer electrodes U and lower layer electrodes L are insulated by the insulation layer 3 and they are connected with each other through contact holes where connection is needed. FIG. 18 is an enlarged fragmentary view of a contact hole shown in FIG. 17. FIG. 19 is a cross-sectional view taken on line A—A' of FIG. 18. FIG. 20 is a cross-sectional view taken on line B—B' of FIG. 18. As explained above, the upper layer electrodes and the lower layer electrodes are insulated by the insulation layer 3 and connected with each other where connection is needed.

However, the signal conductors in matrix unit M are long and they are laid in the multilayer form. For that reason, there exists nonnegligible line-to-line capacitance among signal conductors, in other words among upper layer electrodes or among lower layer electrodes, and capacitive coupling occurs among signal conductors. This line-to-line capacitance can be the cause of crosstalk between adjacent elements or blocks.

FIG. 21 is a circuit diagram which shows an equivalent circuit of part of the matrix wiring unit shown in FIG. 17. In FIG. 21, $C_1$ is line-to-line capacitance created among lower layer electrodes. $C_2$ is line-to-line capacitance created among upper layer electrodes. $C_3$ is capacitance created between upper layer electrodes and lower layer electrodes, especially where they cross. It can be understood from the equivalent circuit that unnecessary capacitive coupling is created between electrodes.

For instance, line-to-line capacitance between a pair of upper layer electrodes of a line sensor, the details of which will be described below, is as much as 120 pF. The reading length of the line sensor is 216 mm, which covers the length of A4 size paper. The pixel density of the line sensor is 8 dot/mm. The number of blocks is 27 and the number of elements is 64 element/block. Since a line sensor has such a large line-to-line capacitance, potential is induced in the adjacent signal conductor or signal line through the line-to-line capacitance when potential fluctuates in a signal conductor according to photoelectric conversion output. For example, when potential fluctuation occurs in upper layer electrode $U_2$ in FIG. 17, potential is induced in the adjacent upper layer electrodes $U_1$ and $U_3$, and when potential fluctuation occurs in upper layer electrode $U_1$ in FIG. 20, potential is induced in lower layer electrode $L_{12}$, which is not connected with upper layer electrode $U_1$, due to capacity coupling.

Crosstalk is caused in this way. Accordingly, the Modulation Transfer Function of the image sensor is decreased and resolution of the read image is degraded. It can be considered that the image sensor is not practical in the circumstances described above.

Since a plurality of lower layer electrodes, in other words plural blocks of lower layer electrodes, are connected with an upper layer electrode, crosstalk between blocks also occurs according to line-to-line capacitance among lower layer electrodes.

SUMMARY OF THE INVENTION

The present invention has been accomplished to solve these problems. It is an object of the invention to provide an improved image sensor and its drive method with a simple structure in which crosstalk does not occur.

The drive method of an image sensor to solve the above described problems will be explained as follows. A drive method of an image sensor having a photoelectric conversion means in which a plurality of photoelectric conversion elements are placed on an array, and further having a matrix wiring unit to read out an output signal from the photoelectric conversion means, comprises a process in which all photoelectric conversion elements can be reset at the same time and a process in which photoelectric conversion elements can be selected and read out in order after the above described resetting process.

In the drive method of an image sensor of the present invention, reading out is conducted after the photoelectric conversion elements have been reset.

The image sensor in the first example of the present invention comprises a photoelectric conversion means in which a plurality of photoelectric conversion elements are placed in the form of an array and comprises a matrix wiring unit to read out an output signal from the photoelectric conversion means. In the matrix wiring unit, the first electrode such as the lower layer layer electrode, the insulation layer, and the second electrode such as the upper layer electrode, are stacked. In the wiring of either the lower layer electrode or the upper layer electrode, there is provided a grounded electrode between electrodes in the layer electrode.

In the image sensor in the first example described above, electrostatic capacitance among the wiring is reduced by the grounded electrode formed in the wiring of either the lower layer electrode or the upper layer electrode.

The image sensor in the second example of the present invention comprises photoelectric conversion means in which a plurality of photoelectric conversion elements are placed in the form of an array and the matrix wiring unit which reads out an output signal from the photoelectric conversion means. The first electrode such as the lower layer electrode, the first insulation layer, the second electrode such as the upper layer electrode, the second insulation layer, and the third electrode such as the upper surface electrode are stacked to form the above-described matrix wiring unit, and the upper surface electrode is grounded.

In the image sensor in the second example of the present invention, the influence of electrostatic capacitance among the wiring is reduced by the upper surface electrode which is formed to cover the wiring of the upper layer electrode.

The image sensor in the third example of the present invention comprises a photoelectric conversion means in which a plurality of photoelectric conversion elements are placed in the form of an array and a matrix wiring unit which can read out an output signal sent from the photoelectric conversion means, wherein the matrix wiring unit is composed of the second electrode such as the upper layer electrode, the third electrode such as the middle layer electrode, the first electrode such as the lower layer electrode, and the first and second insulation layers to insulate these electrodes. The above-described middle layer electrode is grounded and an output from the photoelectric conversion means can be read out through the upper layer electrode and the lower layer electrode.

In the image sensor in the third example of the present invention, electrostatic capacitance between the upper layer electrode and the lower layer electrode is reduced by the middle layer electrode which is placed between the upper layer electrode and the lower layer electrode.

In the above-described examples, the lower layer electrode, the upper layer electrode, the middle layer electrode, and the upper surface electrode are used as an example of the first, the second, and the third electrodes. However, it is to be understood that the invention is not intended to be limited to this specific structure.

BRIEF DESCRIPTION OF THE DRAWINGS

FIG. 4 is an enlarged fragmentary top plan view of FIG. 3.

FIG. 5-*a* is a sectional view taken on line A—A' of FIG. 4.

FIG. 5-*b* is a sectional view taken on line B—B' of FIG. 4.

FIG. 6-*a*, 6-*b*, and 6-*c* are graphs which show the characteristics of the output potential of the image sensor.

FIG. 7-*a*, 7-*b*, and 7-*c* are schematic illustrations which explain the manufacturing process of the image sensor of the first example of the present invention.

FIG. 8-*a* and FIG. 8-*b* are sectional views which show the wiring pattern of the image sensor of the second example of the present invention.

FIG. 9-*a*, 9-*b*, and 9-*c* are schematic illustrations which explain the manufacturing process of the image sensor of the second example of the present invention.

FIG. 18 is an enlarged fragmentary top plan view of FIG. 17.

FIG. 19 is a sectional view taken on line A—A' of FIG. 18.

FIG. 20 is a sectional view taken on line B—B' of FIG. 18.

FIG. 21 is a circuit diagram which shows the equivalent circuit of a conventional matrix wiring unit.

DETAILED DESCRIPTION OF THE INVENTION

Figure 1:
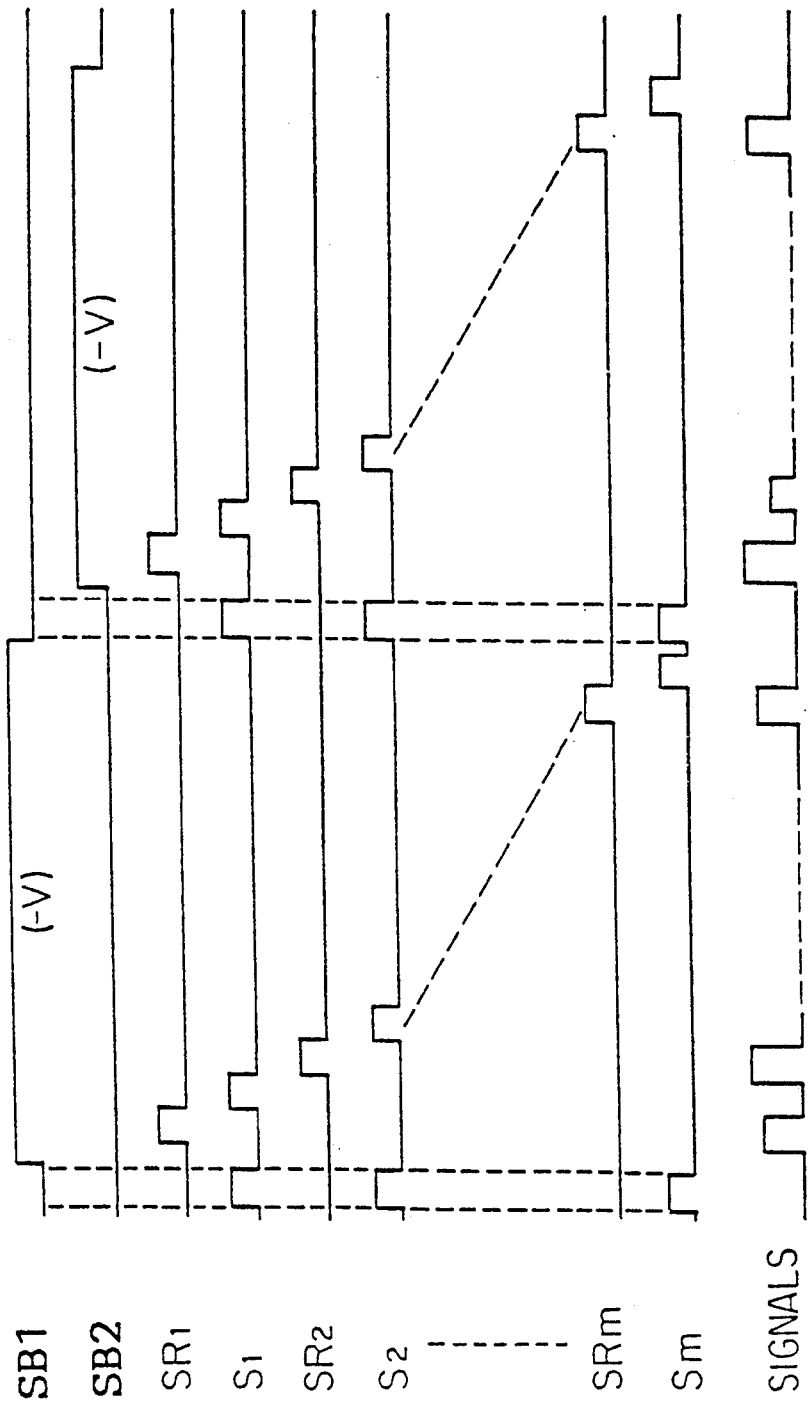
FIG. 1 is a diagram which shows the waveform of a signal and the time to drive the image sensor by the drive method of the present invention.

Referring to the drawings for a more complete understanding of the invention, examples of the invention will be described in detail.

FIG. 1 is a time chart which shows the motion of each portion of an image sensor when it is driven by the drive method of the present invention. A part of the time chart of the blocks the number of which is m is shown. In this drawing, (1-*a*) $B_1$ and (1-*b*) $B_2$ can be selectively changed over to the bias $-V$ or to the ground. Before $B_1$ is connected to the bias $-V$, $S_1$ to $S_m$ are turned on all at once and grounded. This procedure is reset-before-reading. Then $B_1$ is connected to the bias $-V$ and $SR_1$, $S_1$ to $SR_m$, and $S_m$ are turned on in order, to read out the first block. $S_1$ to $S_m$ are turned on and grounded between connecting $B_1$ to the ground and connecting $B_2$ to the bias $-V$. This procedure also is reset-before-reading. Then, $B_2$ is connected to the bias $-V$ and $SR_1$, $S_1$ to $SR_m$, and $S_m$ are turned on in order, to read out the second block. This procedure is repeated hereafter. Since the signals are read out after conducting reset-before-reading, electric charge accumulated in the electrostatic capacitor between the electrodes is discharged. For that reason, crosstalk scarcely occurs.

Figure 2:
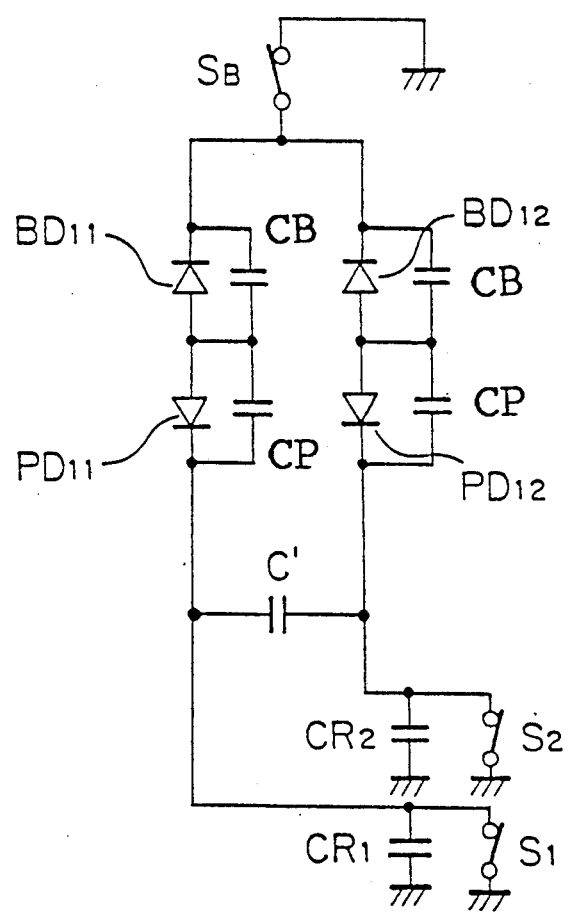
FIG. 2 is an equivalent circuit of a photoelectric conversion element in the case the circuit is reset before reading according to the image sensor drive method of the present invention.

FIG. 2 is a circuit diagram which shows an equivalent circuit in which 'reset-before-reading' is conducted. In FIG. 2, the same numbers are given to the same parts as in FIG. 14. Here is shown a part of the first pixel and the second pixel of the first block. In FIG. 2, C' stands for line-to-line capacitor created between the first pixel and the second pixel. This C' corresponds to the sum of line-to-line capacitor created between the lower layer electrode and that created in the upper layer electrode in the matrix wiring unit. As shown in FIG. 2, when $SB_1$, $S_1$, and $S_2$ are turned on at the same time, line-to-line capacitor C', condenser $CR_1$, and $CR_2$ are short-circuited. As a result, the electric charge accumulated in line-to-line capacitor C' is discharged. The electric charge accumulated in capacitors $C_p$ which are connected with photodiode $PD_{11}$ and $PD_{11}$ in parallel, remains undischarged.

Accordingly, when $SB_i$ (i is $1<i<n$) and $S_j$ (j is $1<j<m$) are reset at the same time, all the electric charge accumulated in the capacitor except in the capacitors connected with the photodiodes, is discharged. Therefore, crosstalk between blocks is reduced.

According to the present invention, although line-to-line capacitor in the matrix wiring unit M still exists, crosstalk between the blocks can be reduced by discharging the electric charge accumulated in line-to-line capacitor by the method of reset-before-reading. In the above-described example, reading out is conducted in order at each block after reset-before-reading. However, it is to be understood that the invention is not intended to be limited to the specific example. In other words, the pixel in each block can be read out all at once after the reset-before-reading of each block. In this case, the storage device may be connected with the output terminal of the reading out amplifier A.

In the present invention, reset is conducted before reading at each block and the electric charge accumulated in line-to-line capacitor between the electrodes in the matrix wiring unit, is discharged. Therefore, the image sensor drive method in which crosstalk does not occur, can be realized.

Figure 14:
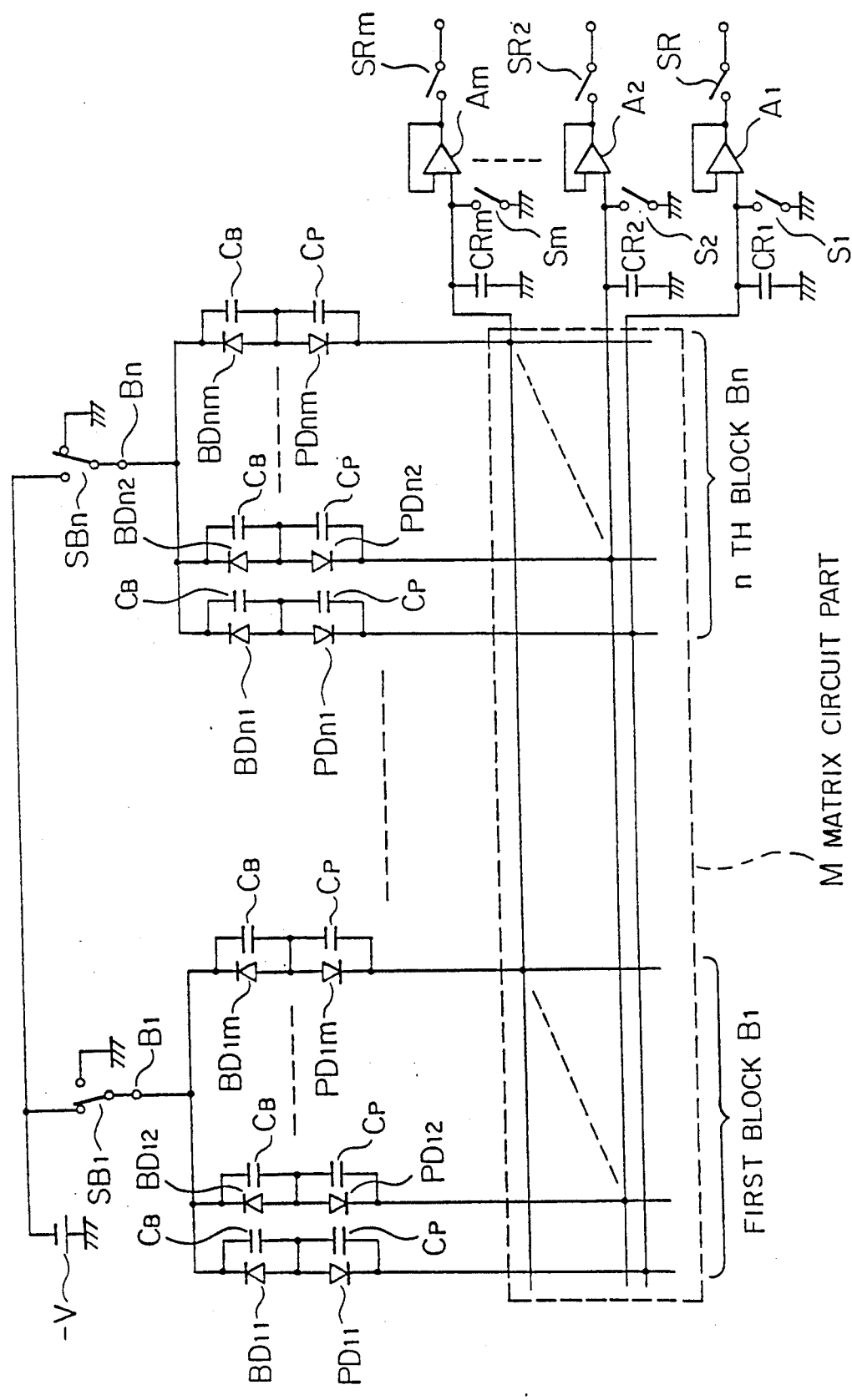
FIG. 14 is a circuit diagram which shows an example of a conventional image sensor circuit.
Figure 15:
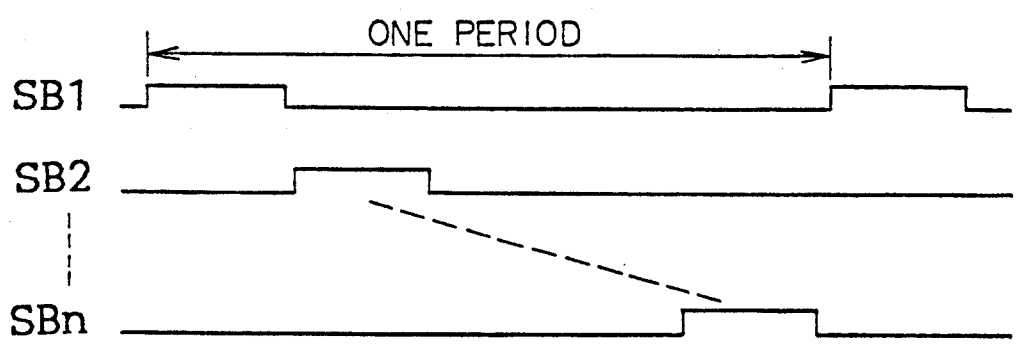
FIG. 15 is a diagram which shows the timing of the signal to select the block.
Figure 16:
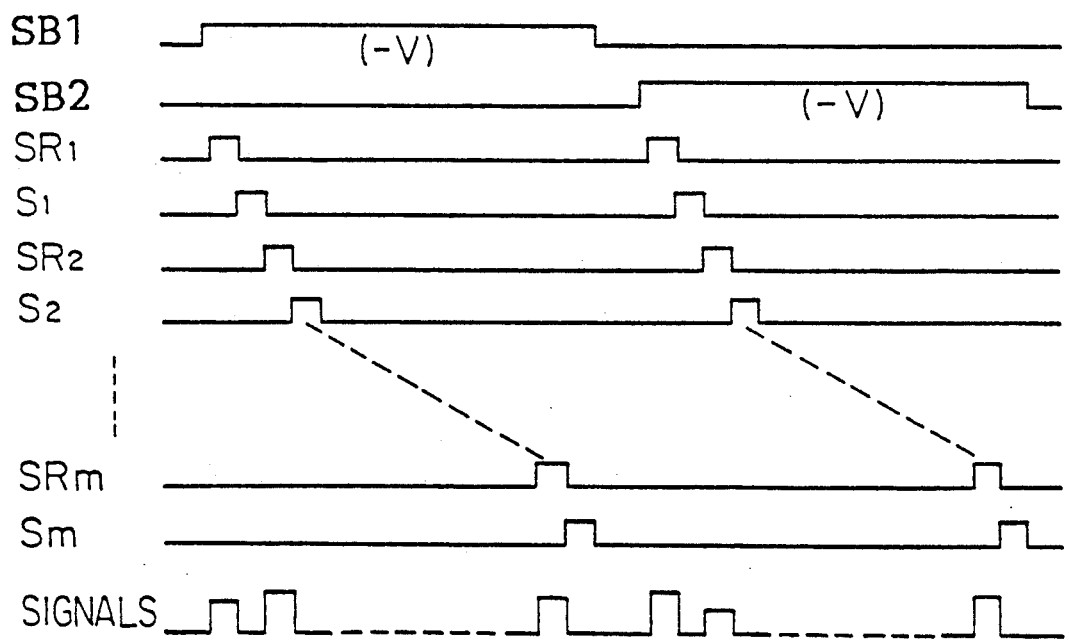
FIG. 16 is a diagram which shows the timing when to drive an image sensor and the waveform of a signal when the image sensor is driven by a conventional drive method.

The image sensor drive method described above can be applied to the conventional image sensor shown in FIG. 14. Crosstalk can be prevented only by this method.

The inventors have improved the structure of an image sensor. As the result of improvement of an image sensor, an image sensor in which crosstalk does not occur even when the conventional drive method is applied, has been realized. The example of the image sensor of the invention will be described in detail as follows.

Figure 3:
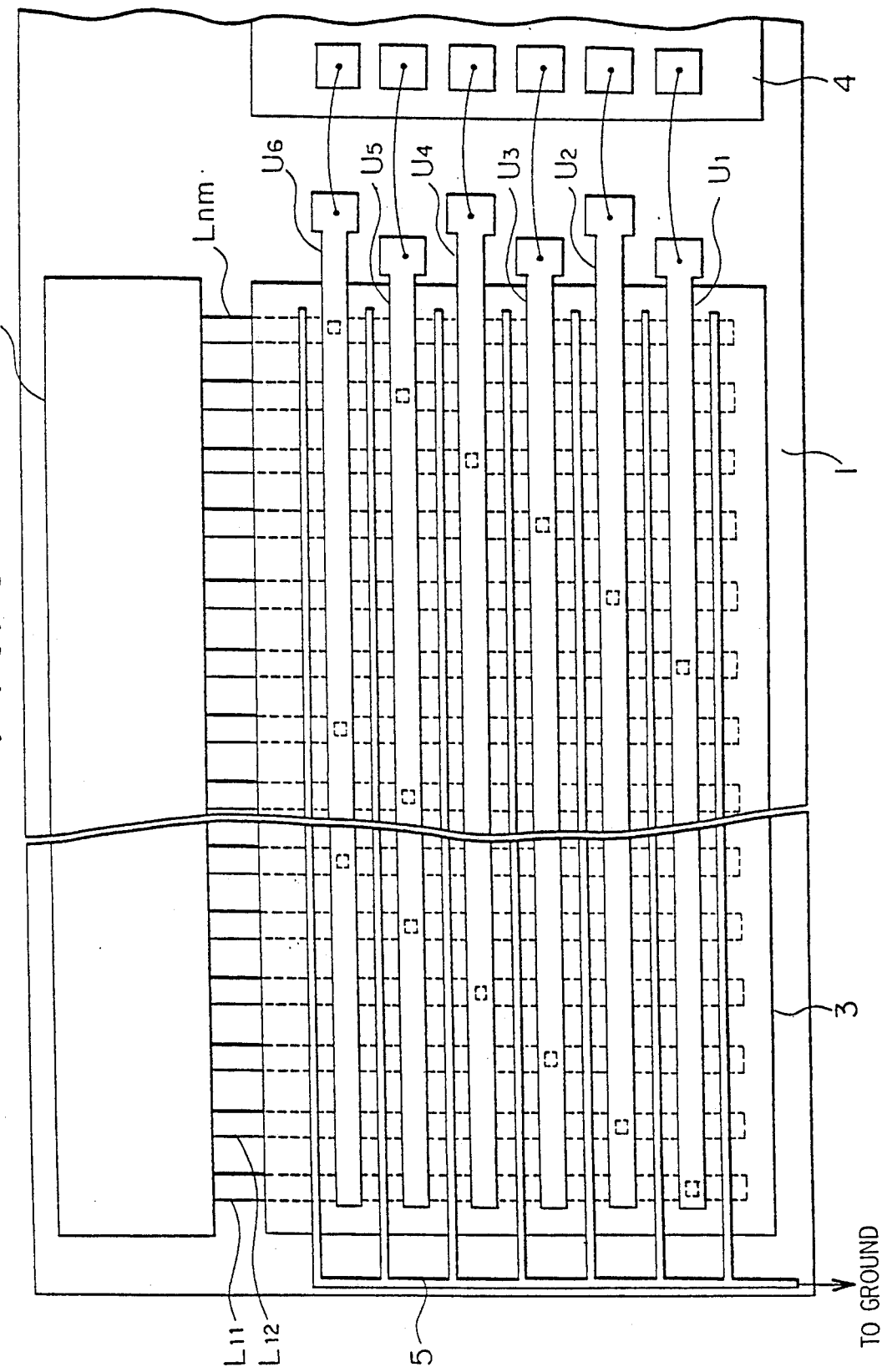
FIG. 3 is a diagram which shows the wiring pattern of the image sensor of the first example.
Figure 17:
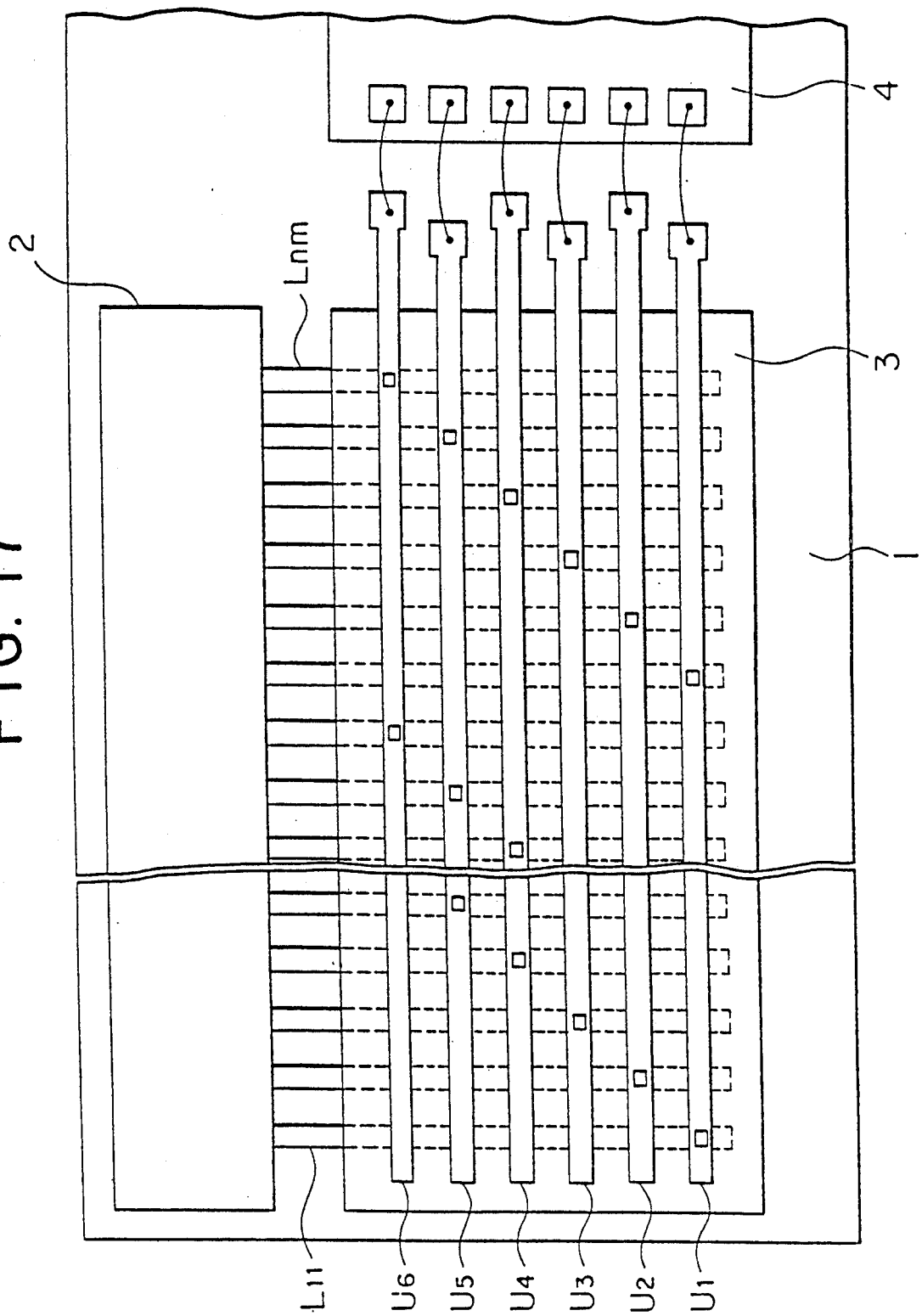
FIG. 17 is a diagram which shows an example of an image sensor circuit pattern on the substrate.

FIG. 3 is the pattern diagram which shows the electric circuit pattern on the substrate of the image sensor of the first example. In this drawing, the same numbers are given to the same parts as in FIG. 17 and the explanation about them is omitted. Although the upper layer electrodes of $U_1$ to $U_6$ are shown in FIG. 3, an explanation will be made on the assumption that there are upper layer electrodes of $U_1$ to $U_m$. In FIG. 3, the numeral 5 is the grounding wiring which is placed among the upper layer electrodes of $U_1$ to $U_m$ and on both sides of the electrodes. The grounding wiring 5 is placed in parallel with the upper layer electrodes of $U_1$ to $U_m$ and the ends of the grounding wiring are connected with the ground together. Accordingly, each upper layer electrode has electrostatic capacitance between the electrode and the ground. However, line-to-line capacitor between the upper layer electrodes is not created. Therefore, crosstalk hardly occurs.

FIG. 4 is an enlarged fragmentary top plan view of FIG. 3. FIG. 5-*a* is a sectional view taken on line A—A' of FIG. 4. FIG. 5-*b* is a sectional view taken on line B—B' of FIG. 4. As shown in the drawings, the upper layer electrode and the lower layer electrode are connected with each other through the contact hole, and the grounding wiring 5 is wired in parallel with each upper layer electrode.

FIG. 6-*a*, 6-*b*, and 6-*c* are graphs which show the characteristics of the output signals which are outputted from the image sensor when white and black patterns, in which black and white lines appear alternately, are read out by the sensor. FIG. 6-*a* shows the characteristics which will be obtained by an ideal image sensor. FIG. 6-*b* shows the characteristics which can be obtained by a conventional image sensor. FIG. 6-*c* shows the characteristics which can be obtained by an image sensor of the present invention. The graphs show the relation between the positions of pixels and the output potential of the image sensor under the conditions that the pixels, the order of which is a, c, e, g, i, k, and m are exposed and other pixels are not exposed. In FIG. 6-*b* and 6-*c*, a line sensor, the details of which will be described below, was used. The reading length of the line sensor is 216 mm which covers the width of A4 size paper. The pixel density is 8 dot/mm. The number of the blocks is 27 and the number of the elements per block is 64 elements/block. The graphs show the characteristics of the line sensor, wherein a black and white pattern of 4 lp/mm was actually read out by the sensor.

When the ideal image sensor shown in FIG. 6-*a* is used, the output potential is obtained only from the pixels the order of which is a, c, e, g, i, k, and m. On the other hand, when the conventional image sensor was used, the potential levels of the exposed pixels were reduced due to the influence of crosstalk, and potential was also generated in the unexposed pixels which were adjacent to the exposed pixels. In this case, MTF (Modulation Transfer Function) is approximately 16%. For that reason, it is not practical.

In the case of the image sensor of the present invention shown in FIG. 6-*c*, the potential levels of the exposed pixels are increased and at the same time the output potential of the unexposed pixels which are adjacent to the exposed pixels is considerably decreased. In this case, MTF is about 60%. It can be understood that the characteristics have been improved. This is because line-to-line capacitance between the upper layer electrodes is decreased due to the grounding wiring placed among the upper layer electrodes and crosstalk between the electrodes is reduced.

FIG. 7-*a*, 7-*b*, and 7-*c* are schematic illustrations which explain the manufacturing process of the matrix wiring unit. A part of the matrix wiring unit is shown here. First of all, referring to FIG. 7-*a*, the lower layer electrodes of $L_{11}$ to $L_{13}$ made from Cr are formed by the sputtering method or the vacuum evaporation method on the substrate 1 on which the photo diode unit 2, which is not shown in the drawing, is formed. The insulation layer 3 made from $SiO_2$, SiN, or polyimide are formed on that. Then etching is conducted by using a mask pattern process. By this process, the insulation layer is removed from the positions where contact holes are made. This process is shown in FIG. 7-*b*. After that, the upper layer electrodes of $U_1$ to $U_3$ made from Al are formed and they are connected with the lower layer electrodes of $L_{11}$ to $L_{13}$ at the contact hols. Then the grounding electrodes are formed between the upper layer electrodes and on both sides. This is explained in FIG. 7-*c*.

In the example described above, the grounding electrodes 5 are formed in parallel with the upper layer electrodes U. However, it is to be understood that the invention is not intended to be limited to the specific example. In other words, the grounding electrodes may be formed in parallel with the lower layer electrodes L, or the grounding electrodes may be formed to both the lower layer electrodes L and the upper layer electrodes U.

As described above, the grounding electrodes L are formed in parallel with the electrodes of the matrix wiring unit in this example. Accordingly, electrostatic capacitance between the electrodes is reduced. Therefore, an image sensor which does not cause any crosstalk can be realized by the simple structure.

FIG. 8-*a* is a sectional view which shows the section of the wiring pattern on the substrate of the image sensor of the second example of the present invention. This drawing shows the section which makes a right angle with the lower layer electrode L. In this drawing, the same numbers are given to the same parts as in FIG. 17, and a detailed explanation is omitted. In FIG. 8-*a*, the numeral 5 is the first insulation layer which is coated on the substrate 1 or the lower layer electrode L. The upper layer electrode U is placed on the first insulation layer 5 and furthermore the second insulation layer 6 is placed on the upper layer electrode U. The upper grounding electrode 7 is formed on the second insulation layer 6. The upper grounding electrode 7 is connected with the ground of the electric circuit. Therefore, the area where the upper layer electrode U and the lower layer electrode L face the upper surface grounding electrode 7 is large, so that comparatively large electrostatic capacitance $C''$ exists between them. Therefore, line-to-line capacitance $C'$ which exists between the upper layer electrodes and between the lower layer electrodes is relatively small compared with the above-mentioned electrostatic capacitance $C''$. Accordingly, the influence of crosstalk can be nearly eliminated.

FIG. 8-*b* shows a section which makes a right angle with the upper layer electrodes U. The portions close to the upper layer electrodes $U_{11}$ and $U_{12}$ are shown here. Generally speaking, electrostatic capacitance C between conductors which are set in parallel is in proportion to the opposed area and in inverse proportion to the distance between conductors. Therefore, it is obvious that electrostatic capacitance between the upper grounding electrode 7 and each electrode is large since the opposed area is large.

In this example, line-to-line capacitance between the electrodes is relatively small compared with electrostatic capacitance between the upper grounding electrode and the upper layer electrode or the lower layer electrode. As a result, crosstalk hardly occurs. For that reason, its MTF is improved to about 60% in the same way as in the first example shown in FIG. 6-*c*.

FIG. 9-*a*, 9-*b*, and 9-*c* are schematic illustrations to explain the manufacturing process of the matrix wiring unit M. A part of the matrix wiring unit is shown here. The lower layer electrodes of $L_{11}$ to $L_{13}$ made from Cr are formed by the sputtering method or the vacuum evaporation method on the substrate 1 on which the photo diode unit 2, which is not shown in the drawing, has already been formed. This is shown in FIG. 9-*a*. The first insulation layer 5 made from $SiO_2$, SiN, or polyimide is formed on that. After that, etching is conducted by using a mask pattern process. In other words, the insulation layer is removed where the lower layer electrode is to be connected with the upper layer electrode through the contact hole. This is shown in FIG. 9-*b*. Then, the upper layer electrodes of $U_1$ to $U_3$ made from Al are formed and connected with the lower layer electrodes of $L_{11}$ to $L_{13}$. This is shown in FIG. 9-*c*. After that, the second insulation layer 6 is formed over the matrix wiring unit M and the upper grounding electrode 7 is formed on the second insulation layer 6. The upper grounding electrode 7 is connected with the ground of the electric circuit.

In the above-mentioned example, the upper grounding electrode 7 is formed all over the second insulating layer 6 surface. However, it is to be understood that the invention is not to be limited to the specific example. For instance, the upper grounding electrode may be formed in accordance with the pattern shape of the upper layer electrode U or the lower layer electrode L.

As mentioned above, the second insulation layer 6 and the upper grounding electrode 7 are formed on the matrix wiring unit in this example. Accordingly, electrostatic capacitance between electrodes can be relatively reduced. Therefore, crosstalk can be decreased. As a result, it is possible to realize with a simple structure of an image sensor which does not create any crosstalk.

Figure 10:
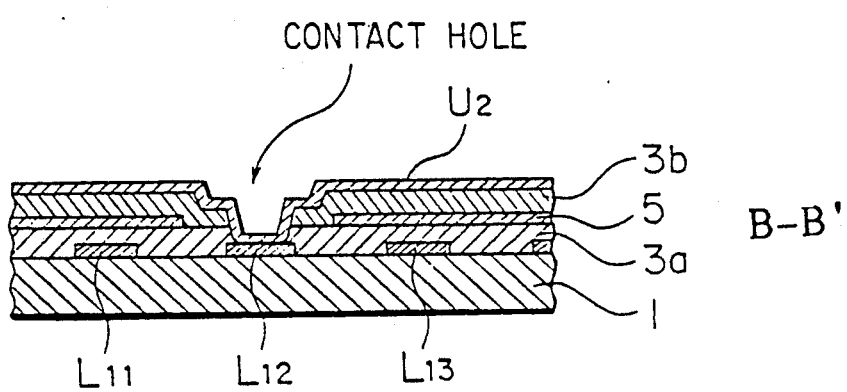
FIG. 10 is a sectional view of the matrix wiring unit of the third example of the present invention.

FIG. 10 is a sectional view which shows the section of the wiring pattern of the matrix wiring unit on the subtrate of the image sensor of the third example. This drawing is a sectional view taken on line B—B' of FIG. 11. FIG. 10 shows the section which makes a right angle with the lower layer electrode L. In the drawing, the same numbers are given to the same parts as in FIG. 17 and a detailed explanation is omitted.

The numeral $3a$ is the first insulation layer placed on the substrate 1 and the lower layer electrode L. The numeral 5 is the middle layer electrode placed on the first insulation layer $3a$. The numeral $3b$ is the second insulation layer placed on the middle electrode 5. The substrate 1, the lower layer electrode L, the first insulation layer $3a$, the middle electrode 5, the second insulation layer $3b$, and the upper layer electrode U are stacked in order. The middle layer electrode 5 is connected with the ground of the electric circuit. Accordingly, no electrostatic capacitance exists between the upper layer electrode $U_2$ and the lower layer electrodes $L_{11}$ to $L_{13}$ at the crossing positions in this drawing. Each electrode has electrostatic capacitance between them and the middle layer electrode 5. In other words, the middle layer electrode 5 functions as a shield plate. For that reason, crosstalk is hardly created.

Figure 11:
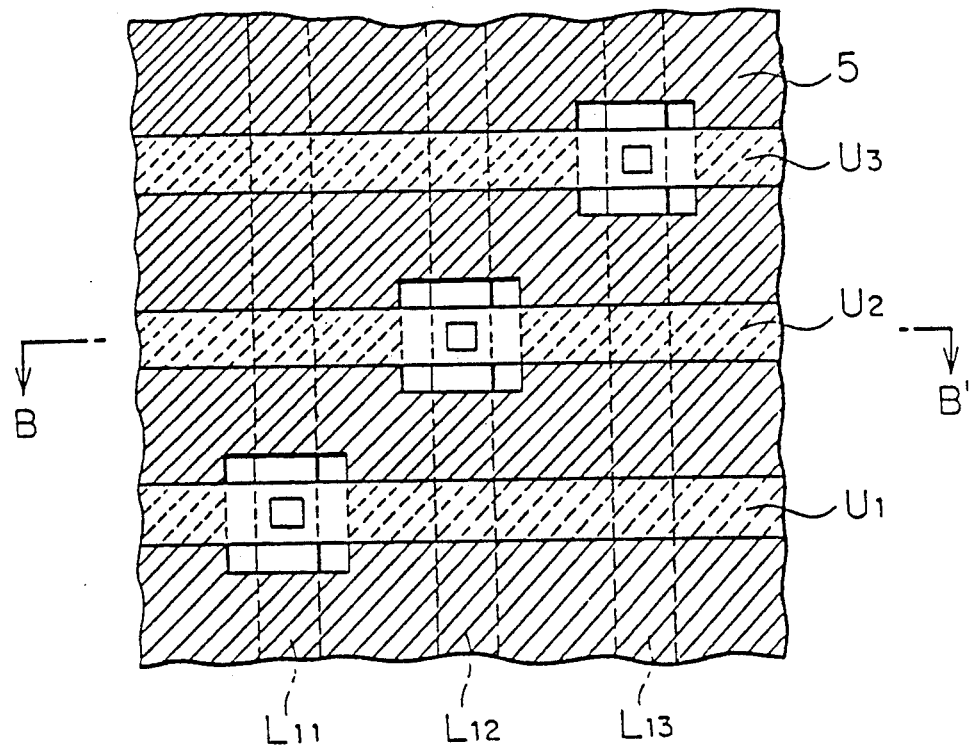
FIG. 11 is a schematic illustration which shows the surface of the matrix wiring unit.

FIG. 11 is a drawing which shows the surface of a part of the matrix wiring unit. In this drawing, a $3 \times 3$ portion is shown. The lower layer electrodes $L_1$ to $L_3$ are placed on the substrate 1 and the first insulation layer $3a$ insulates except the portion where the electrodes are connected through the contact holes. The middle layer electrode 5 is uniformly placed on the first insulation layer $3a$. The second insulation layer $3b$ is placed on the middle layer electrode 5. The upper layer electrodes $U_1$ to $U_3$ are placed on the second insulation layer $3b$ in the direction making a right angle with the lower layer electrode. The lower layer electrodes $L_1$ to $L_3$ and the upper layer electrodes $U_1$ to $U_3$ are connected with each other through the contact holes. Since the middle layer electrode 5 exists between the upper layer electrodes and the lower layer electrodes where the contact holes do not exist, unnecessary capacity coupling is not created.

Figure 12:
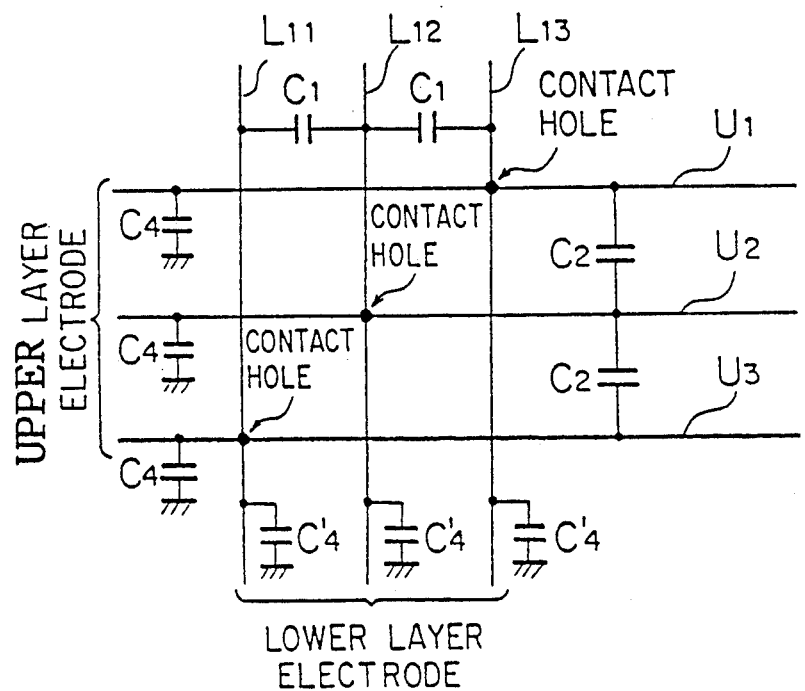
FIG. 12 is a circuit diagram which shows the equivalent circuit of the matrix wiring unit.

FIG. 12 is the equivalent circuit of the matrix wiring unit which is shown in FIG. 11. In this drawing, $C_1$ is line-to-line capacitance created between the lower layer electrodes. $C_2$ is line-to-line capacitance created between the upper layer electrodes. $C_4$ is capacitance created between the upper layer electrode and the middle layer electrode 5 which is operated as the standard potential. The middle layer electrode 5 has the standard potential. $C_4'$ is capacitance created between the lower layer electrode and the middle layer electrode 5. Judging from the circuit diagram, it can be understood that unnecessary capacity coupling is not created. Since capacitance $C_4$ and $C_4'$ are included in the reading condenser CR, it causes no problem.

Figure 13:
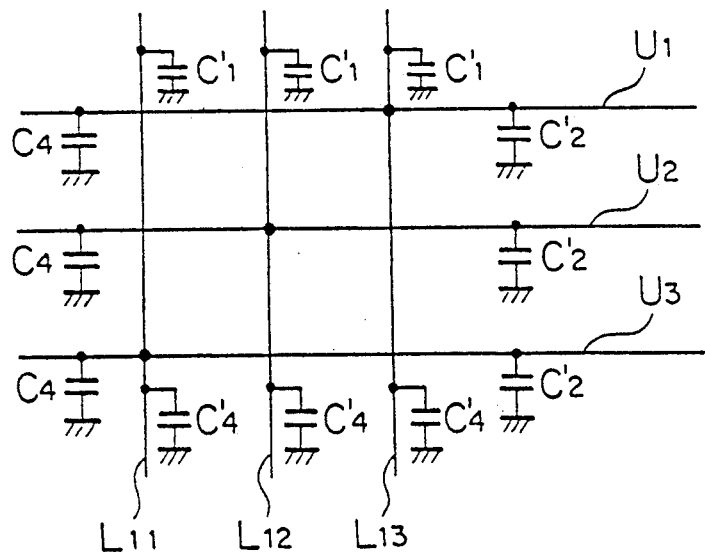
FIG. 13 is a circuit diagram which shows another equivalent circuit of the matrix wiring unit.

FIG. 13 is an equivalent circuit of the improved example. The substrate 1, the lower layer electrode L, the first insulation layer $3a$, the middle layer electrode 5, the second insulation layer $3b$, and the upper layer electrode U are stacked. A plurality of grounding electrodes are placed in parallel with each lower layer electrode L and a plurality of grounding electrodes are placed in parallel with each upper layer electrode U. In the above-described structure, capacitance $C_1$ which was created between the upper layer electrodes, and capacitance $C_2$ which was created between the lower layer electrodes, are not now created. The reason for that is that capacitance $C_1'$ is created between the upper layer electrodes and the middle layer electrode 5 of the standard potential and capacitance $C_2'$ is created between the lower layer electrodes and the middle layer electrode 5 of the standard potential. Accordingly, unnecessary capacitance does not exist at all in the above-described structure and an ideal characteristic can be expected. Since capacitance $C_1'$ and $C_2'$ is included in the reading condenser CR, it causes no problem.

Although the middle layer electrode 5 is formed over the second insulation layer $3b$ in the above-mentioned example, it is to be understood that the invention is not intended to be limited to the specific example. For example, the middle layer electrode 5 may be formed in accordance with the pattern shape of the upper layer electrode U or the lower layer electrode L. The pattern of the upper layer electrode U may be opposite to that of the lower layer electrode L.

As explained above, the middle layer electrode is placed between the lower layer electrode and the upper layer electrode on the substrate in this example. Therefore, unnecessary capacitance between the electrodes can be reduced. As a result, crosstalk can be reduced. Accordingly, an image sensor with a simple structure which does not create crosstalk can be realized by the present invention.

What is claimed is:

1. A method of driving an image sensor, the image sensor being provided with plural groups of photoelectric conversion elements, each element having a voltage input terminal and an output terminal, and each group of elements having a predetermined number of elements and a common voltage switch connected to all the voltage input terminals of the predetermined group of elements, and a matrix wired circuit having read-out lines corresponding in number to the predetermined number of elements within a group, each read-out line having a branch line connected to an output terminal of each element, and a reset switch, having a reset position and a work position, associated with each read-out line, the method comprising the steps of:

simultaneously applying an OFF voltage level to the common voltage switch of each group of elements and thus applying the OFF voltage level to the voltage input terminal of each element, and applying a reset signal to the reset switch of each read-out line to initialize the read-out lines;

simultaneously applying an ON voltage level to the common voltage switch of a group to be read and thus applying the ON voltage level to the voltage input terminals of each of the predetermined number of elements within the group to be read, and applying a work signal to each reset switch;

photoelectrically converting an image light signal into an electric signal by each of the predetermined number of elements within the group to be read;

transmitting the electric signal from each of the predetermined number of elements within the group to be read through the read-out lines to a reading unit.

2. The method of claim 1, wherein the OFF voltage level is ground.

3. The method of claim 1, wherein the step of transmitting the electric signal from each element within the group to be read is a step of sequentially reading out the electric signals one by one from the predetermined number of elements within the group to be read.

* * * * *